United States Patent [19]
McElroy et al.

[11] Patent Number: 5,350,706
[45] Date of Patent: Sep. 27, 1994

[54] CMOS MEMORY CELL ARRAY

[75] Inventors: Dave J. McElroy, Allen; Manzur Gill, Arcola; Pradeep L. Shah, Dallas, all of Tex.

[73] Assignee: Texas Instruments Incorporated, Dallas, Tex.

[21] Appl. No.: 954,368

[22] Filed: Sep. 30, 1992

[51] Int. Cl.⁵ .............................. H01L 21/70
[52] U.S. Cl. ........................ 437/52; 437/43; 437/48; 437/69; 437/70
[58] Field of Search .............. 437/43, 48, 52, 69, 437/70; 257/315

[56] References Cited

U.S. PATENT DOCUMENTS

| | | | |
|---|---|---|---|
| 4,151,021 | 4/1979 | McElroy | 437/43 |
| 4,267,632 | 5/1981 | Shappir | 437/43 |
| 5,019,527 | 5/1991 | Ohshima et al. | 437/43 |
| 5,045,489 | 9/1991 | Gill et al. | 437/43 |
| 5,081,056 | 1/1992 | Mazzali et al. | 437/43 |
| 5,120,671 | 6/1992 | Tang et al. | 437/43 |

FOREIGN PATENT DOCUMENTS

| | | | |
|---|---|---|---|
| 0152673 | 6/1989 | Japan | 437/43 |

*Primary Examiner*—Tom Thomas
*Attorney, Agent, or Firm*—Ann Livingston; Leo N. Heiting; Richard L. Donaldson

[57] ABSTRACT

A CMOS memory cell array and a method of forming it, which avoids problems caused by field oxide corner-rounding. A moat pattern defines alternating columns of active areas and field oxide regions. A source line pattern defines rows of source lines. Silicon dopant is implanted in areas not covered by the source line pattern to form buried n+ source lines. The field oxide regions are formed in areas not covered by the moat pattern. Subsequent fabrication steps may be in accordance with conventional CMOS fabrication techniques.

7 Claims, 4 Drawing Sheets

CMOS MEMORY CELL ARRAY

TECHNICAL FIELD OF THE INVENTION

This invention relates to electronic semiconductor devices, and more particularly to a CMOS memory cell array that avoids undesired effects of field-oxide isolation regions with rounded corners.

BACKGROUND OF THE INVENTION

Field isolation regions are used in integrated circuit memory arrays to isolate memory cells from each other. EPROMS (erasable and programmable memories) are a type of CMOS transistor array that requires field isolation. Most EPROMs being manufactured today have single-transistor memory cells. The transistor has a double-poly gate structure, or "stack" in which an upper poly forms the control gate and wordlines and a lower poly form a floating gate. Field oxide (FOX) regions are used to provide capacitive coupling between these gates, as well as to isolate adjacent cells.

FIG. 1 illustrates the FOX regions of a portion of a conventional EPROM or EEPROM array. In conventional fabrication, the source lines are implanted after the formation of the FOX regions and the gate "stack". After the stack etching, the implant is performed such that the implants are self-aligned to the stack and the field oxide edges The FOX regions form an array of "islands" each designed to have a sideways "H" shape. Cells having this pattern of FOX regions are sometimes referred to as "H cells". They are also sometimes referred to as "T cells" because the active areas are T-shaped.

Despite the straight-edged design of the FOX regions, after fabrication, their actual shape resembles a "dog bone" as illustrated by the dotted lines The field oxide corners are rounded instead of square. This rounding occurs as a result of limitations of photolithography optical resolution and a different oxidation rate at the corner areas.

The rounded ends of the FOX regions have undesirable effects, well known in the art of semiconductor fabrication. For example, if misalignment occurs between the field oxide regions and transistor gates, the channel widths of two adjacent transistors across the source line may differ, and the channel widths may vary across the length of each transistor. If cells in two adjacent rows share a source line, as is the case in some memory array layouts such as flash EEPROMs having a "double poly" structure, the capacitive coupling ratio between the control gate and floating gate may vary from cell to cell across the source line. The result is unequal programming and erase characteristics.

A need exists for a CMOS memory array structure and a method of fabricating it that avoids undesired effects of field oxide corner rounding.

SUMMARY OF THE INVENTION

One aspect of the invention is an array of memory cells fabricated on a semiconductor substrate, each memory cell having a CMOS transistor. Each column of cells corresponds to an active area "moat" on which the transistor elements are fabricated. The moats are isolated by means of field oxide strips, which form continuous strips parallel to, and alternating with, the moats. Source lines are perpendicular to the moats and connect source regions. The source lines are fabricated with a source line mask, which masks areas not to be implanted with a source line dopant.

Another aspect of the invention is a method of fabricating a CMOS memory cell array on a semiconductor substrate, with source lines perpendicular to field oxide regions. First, a moat process is performed on the semiconductor surface. The moat mask has columns that define active areas of cells, and is used to protect those areas from a channel stop implant. After the moat process, a source line process is performed on the semiconductor surface to define the source lines. The source lines are implanted with an n-type dopant. The source line mask is removed, and thick oxide regions are grown in nonactive areas, as well as in source line regions. The remaining process for fabricating the memory cell array may be performed with conventional methods for forming components such as drains, gates, and bitlines.

In an alternative embodiment of the invention, source lines implanted before the moat process is performed.

A technical advantage of the invention is that the source lines are defined by their own source line mask, instead of by edges of the field isolation regions. As a result, the field isolation regions can be formed in continuous columnar strips that separate active areas. If a vertical misalignment occurs during fabrication of transistor gates, the relative arrangement between the gates and their adjacent field oxide regions is less likely to be affected.

DETAILED DESCRIPTION OF THE INVENTION

The description herein is in terms of a memory cell array for a flash EEPROM (electrically erasable and programmable memory). The EEPROM is a CMOS array, having active areas that correspond to its columns and wordlines that correspond to its rows. A source line runs parallel to and between each row. Each cell of the array has only one transistor. However, the invention is not necessarily limited to flash EEPROMs or EPROMs having only one transistor; it could be used for any memory cell array having similarly oriented active areas and source lines.

Figure 3B:
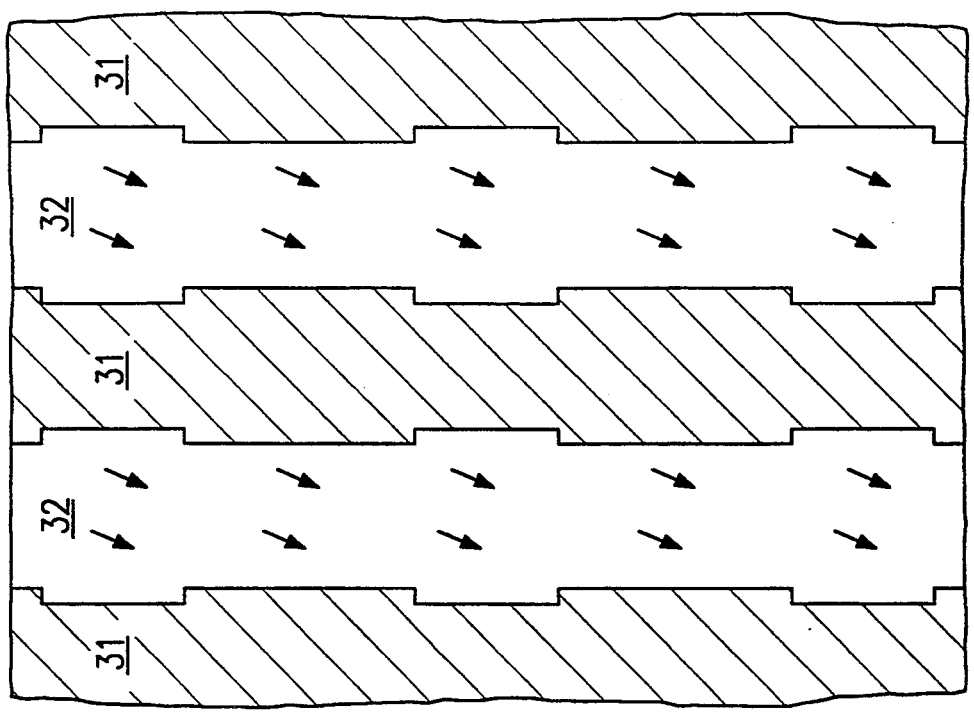
FIGS. 3A–3D illustrate a process of fabricating EEPROM cells that results in continuous columns of field oxide regions.
Figure 3A:
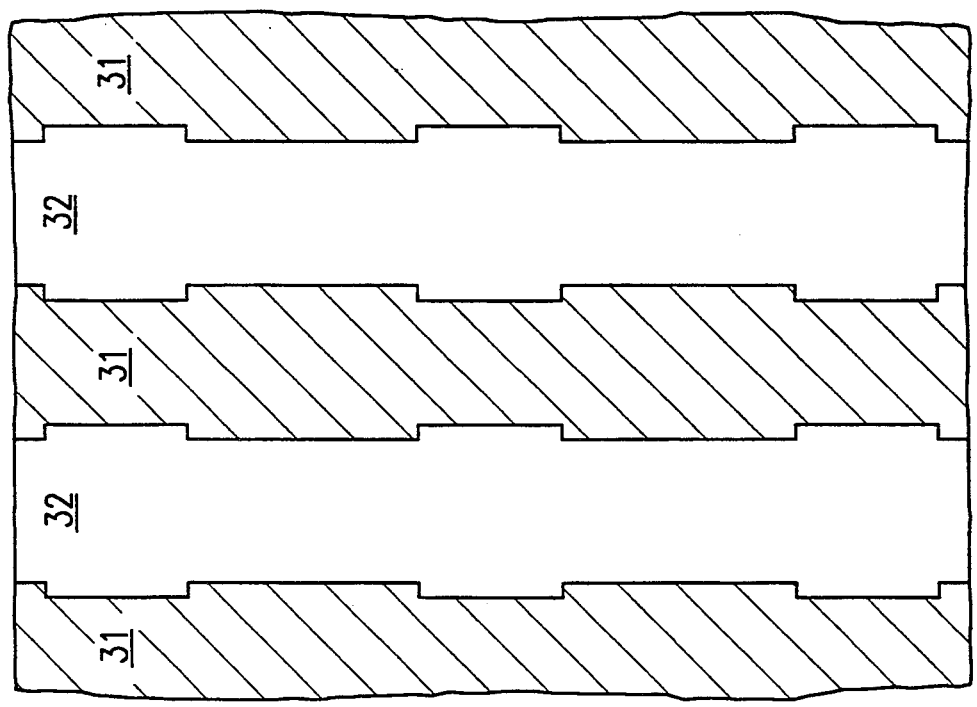
Figure 3D:
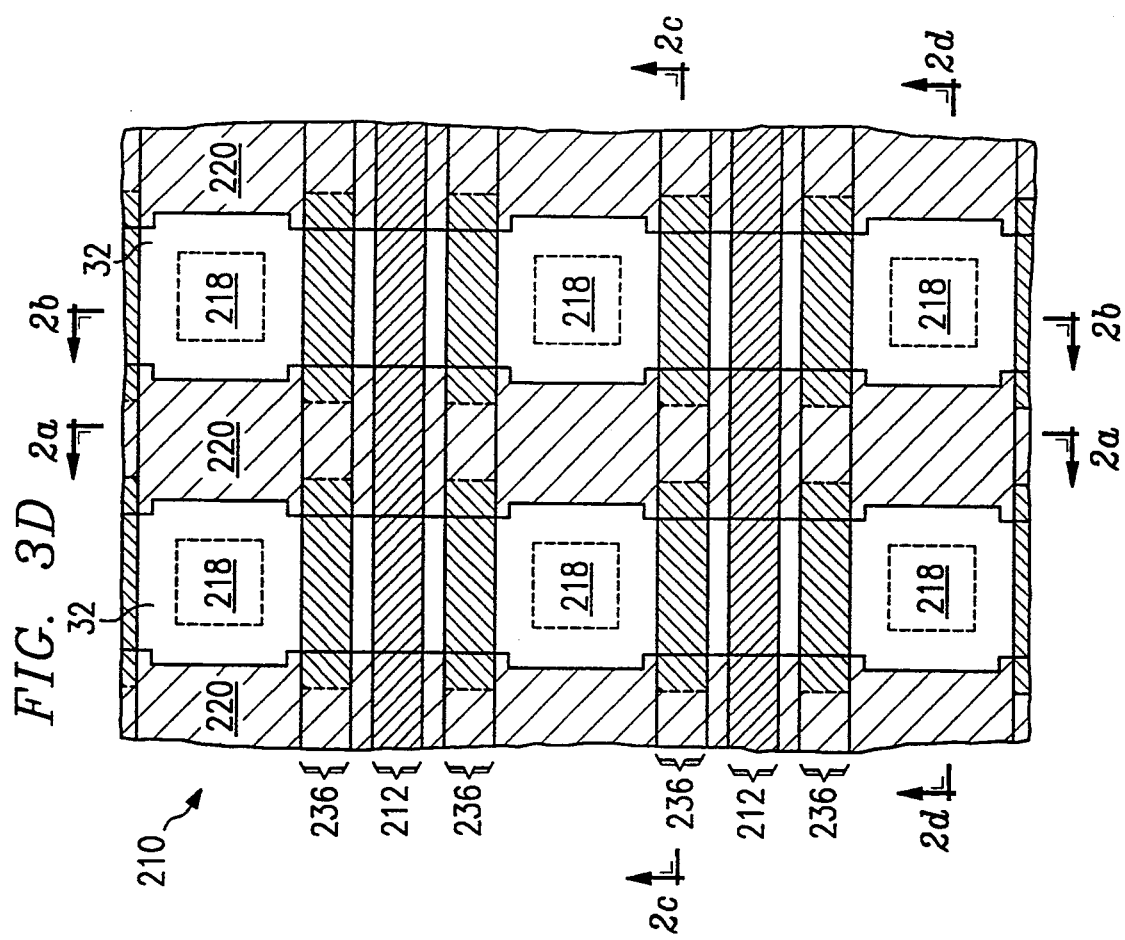

FIGS. 2A–2D are elevation views of a portion of an EEPROM, taken along lines a—a, b—b, c—c, and d—d, respectively, of FIG. 3D. FIG. 3D represents only a partially completed wafer, thus FIGS. 2A–2D show where the elements of a finished memory cell array are located with respect to each other. As will be explained below, many of the features of FIGS. 2A–2D are the same of those of existing EEPROM arrays. However, an important feature of the invention is that field oxide isolation (FOX) regions 220 are not used to define source lines 212, and therefore, are not spaced between source lines 212. Instead, the source lines 212 are fabricated prior to the FOX regions 220, using a "buried n+" technique. The FOX regions 220 are fabricated as continuous columns, which separate alternating columns (moats) that will be used for transistor active areas.

Referring to FIGS. 2A-2D, as an overview of the final structure of an EEPROM memory cell array, the cells are formed on the surface of a p-type silicon substrate 210. Source lines 212, which are n+type, connect source regions 214 of the cells. Drain column lines 216 connect drain regions 218 of columnar pairs of cells.

Cell-isolation thick-field oxide (FOX) regions 220 and channel stop regions 222 provide isolation between columns of cells. The channel region 224 is between source regions 214 and drain regions 218. A gate insulator layer 226 separates channel region 224 from floating gate 230.

Floating gate 230 is insulated from control gate 232 by an inter-level dielectric layer 234. For each memory cell, a wordline 236 includes a control gate 232.

FIGS. 3A-3D illustrate one embodiment of the method of the invention, which is a method of fabricating an array of memory cells. The method results in field oxide (FOX) regions 220 in continuous columns, and thereby avoids the effects from the rounded ends of the FOX "islands" of prior art methods.

FIGS. 3A-3D are plan views of a portion of various layers of a memory cell array during different phases of fabrication. Conventional techniques are used unless otherwise stated herein. The figures, and their various layers and areas are not drawn to an absolute or relative scale, but are for purposes of illustration only.

Referring to FIG. 3A, fabrication begins with a substrate 210 of a first conductivity type. For purposes of this description, this first conductivity type is p-type silicon. A second conductivity type used in subsequent steps for active regions is n-type. A pad oxide layer 31 is deposited or grown over substrate 210, and typically has a thickness of 200-400 angstroms. A nitride layer is then deposited over pad oxide layer 31, at a thickness of 1300-2000 angstroms. Typically, the nitride layer is deposited by means of a low pressure chemical vapor deposition process.

Moat pattern 32 is formed and etching is performed on the surface of substrate 210, using conventional lithographic and etch procedures. Moat pattern 32 defines "moats" within its boundaries, each of which will contain thin oxide and diffusion areas to form transistor components, i.e., channel, drains and sources. Each moat defined by moat pattern 32 corresponds to a column of cells of the array.

As shown in FIG. 3B, the areas of substrate 210 not covered by the photoresist of moat pattern 32 are etched down to the pad oxide 31. These exposed areas are subjected to a channel stop implant, with the implant material typically being boron. Moat pattern 32 prevents the boron from penetrating the silicon in the active areas. Next, the photoresist is stripped from the wafers, and the wafers are cleaned.

Figure 3C:
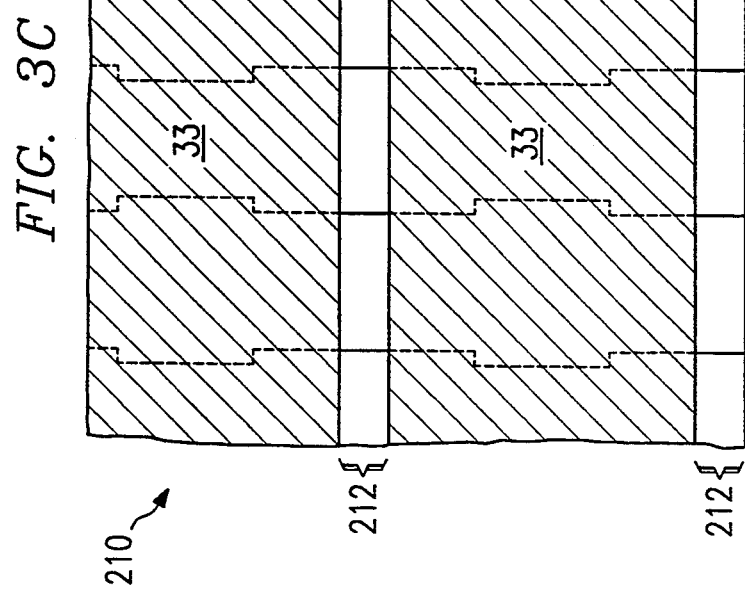

As shown in FIG. 3C, a source line pattern 33 is next formed, using conventional lithographic and etch procedures. As a result of the source line pattern 33, the areas that are to become source lines 212 are not covered with photoresist and are exposed down to substrate 210.

An implant of a second conductivity type, which for purposes of this description is n-type is then selectively implanted to form source lines 212. The process of implanting n-type material to form a "buried n+" region is generally known in the art of semiconductor fabrication. Any one of a number of known n-type silicon dopant materials may be used, i.e., arsenic, phosphorous, or antimony. Appropriate implant energy levels and doses for n+ source lines 212 are known to those skilled in the art. For example, arsenic implantation may be performed with 50-200 keV at a dose of 2E15 to 8E15 per square centimeter.

After implantation, photoresist removal of source line pattern 33, clean-up, and implant anneal, an oxidation is performed. This oxidation is for formation of FOX regions 220. Typically, FOX regions 220 are thermally grown with a localized oxidation (LOCOS) process. However, FOX regions 220 may also be formed in any other suitable manner. During this oxidation, thick oxide grows in regions 220 as well as over source lines 212.

Figure 1:
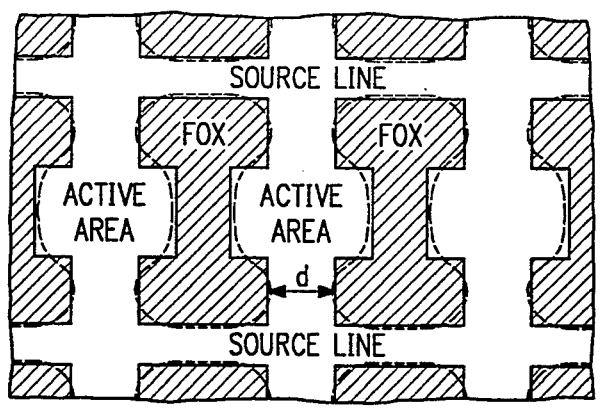
FIG. 1 illustrates the field oxide regions of a portion of a conventional EEPROM array.
Figure 2C:
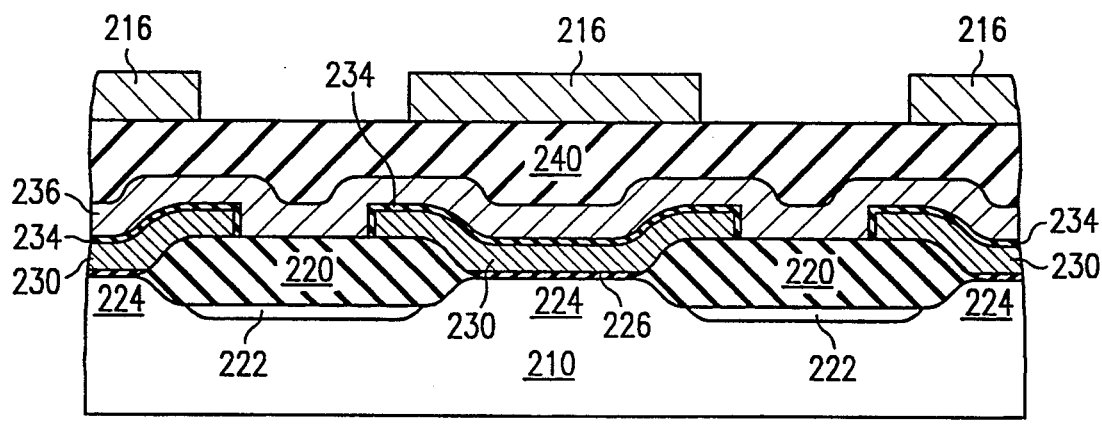
FIGS. 2A–2D are elevation views of a portion of an EEPROM, taken along lines a—a, b—b, c—c, and d—d, respectively of FIG. 3D.
Figure 2D:
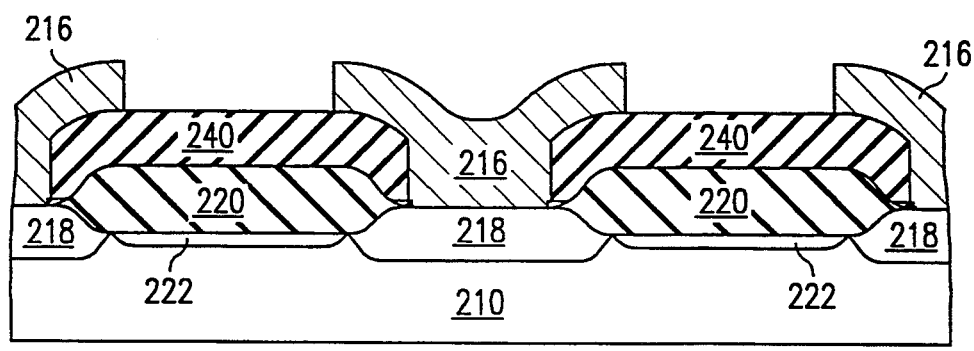
Figure 2A:
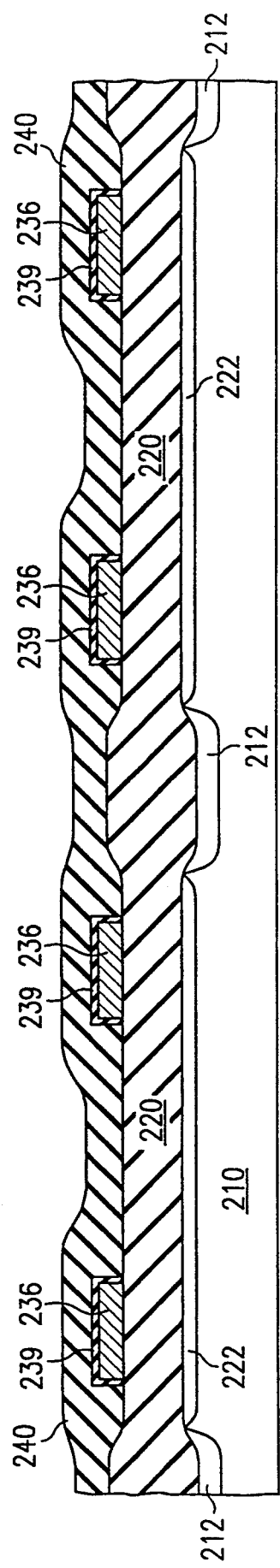
Figure 2B:
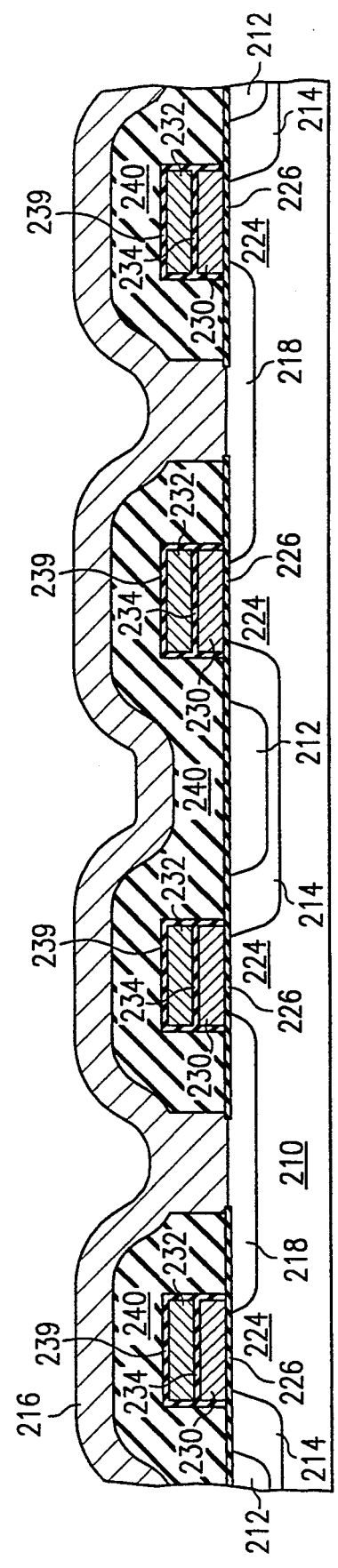

Unlike prior art methods of fabricating source lines, the FOX regions are not used for self-aligning. Thus, thick oxide regions 220 are continuous columnar strips, not separated by source lines 212 as are the prior art FOX regions of FIG. 1. If a vertical misalignment occurs during subsequent fabrication steps, there are no spaced "dog bone" ends to cause problems.

FIG. 3D shows the source lines 212 buried under thick oxide regions 220. The source line pattern 33 from FIG. 3C has been removed. The region at the intersection of channel stop 222 and source line 212 has been exposed to both a boron and an arsenic implant, and hence is slightly compensated. As a result, the sheet resistance of this intersection is slightly higher than the resistance of other parts of source lines 212. Also, the thickness of the thick oxide in the area of source lines 212 may be greater than in the other parts of thick oxide regions 220, if, for example, arsenic is used in the source line regions 212.

In an alternative embodiment of the method of the invention, source lines 212 are implanted with a dopant such as arsenic, silicon annealed, and oxidized before moat process is performed. For this embodiment, the source line pattern 33 would be formed on substrate 210, the source lines 212 implanted, followed by implant anneal and oxidation. Then moat pattern 32 would be formed and used to implant the channel stop layer 222, followed by the formation of FOX regions 220.

As a result of the above-described embodiments, the rows of source lines 212 are defined by the source line pattern 33. The LOCOS process does not affect the shape of the boundaries of source lines 212. Even if the LOCOS process results in rounded corners or other encroachments, the columnar layout of FOX regions 220 avoids gate misalignment problems.

After the formation of FOX regions 220, the fabrication process may be the same as for existing CMOS memory cell arrays. For EEPROM fabrication, U.S. patent Ser. No. 723,010, entitled "EEPROM Cell Array With Tight Erase Distribution", which is incorporated herein by reference, describes how the gate stack, wordlines, bitlines, and other layers are fabricated.

As a summary of the fabrication process after field oxidation, the remaining portions of the pad-oxide and silicon-nitride layers are removed. This procedure exposes the silicon substrate 210 between the FOX regions 220. Next, high-quality gate oxide is grown to a thickness of 80-150 angstroms, followed by threshold-adjust implant.

The process of forming the floating-gate conductors is performed by depositing a layer of first-level polysilicon (poly-1) over substrate 210. The poly-1 layer is deposited to a thickness of about 1500-2500 angstroms.

This layer is doped n-type with phosphorous and may be de-glazed, if needed. The poly-1 layer is patterned with photoresist to define insulated floating-gate strips, to define two edges of the floating gates 230. The photoresist covering the tops of the floating-gate strips is then removed.

After the floating-gate strip fabrication, an interlevel insulator layer such as oxide/nitride/oxide (ONO) of equivalent oxide (dielectric) thickness in the range of 200–400 angstroms is formed over and around the poly-1 strips by conventional techniques. A second-level polysilicon (poly-2) layer 2000–4500 angstroms thick is then deposited over the face of the substrate 210, highly doped n+ to make it conductive, then de-glazed. Photoresist is applied to define wordline stacks that include the poly-2 layer, the inter-level insulator layer, and the poly-1 layer that forms columnar floating-gate strips. Next, a stack-etch procedure is used to create the wordlines 236.

The next step is to implant, using a photoresist process on the source and drain side of each channel 224, the shared n+ sources 214 shared n+ drains 218. An additional source implant may also be applied for a graded source junction, known in the art. The stack-etched poly-1 and poly-2 strips form an implant mask covering the channel regions 224 between sources 214 and drains 218. An arsenic implant is performed at a dosage of about $5 \times 10^{15}$ cm$^{-2}$ at about 60–130 KeV to create the self-aligned n+ source regions 214 and self-aligned n+ drain regions 218.

An oxide layer 239 is then grown over substrate 210, including over wordlines 236, drain regions 218 and source regions 214. Oxide layer 239 is shown only on and around poly-1 and poly-2 stack in FIGS. 2A and 2B. It enhances data retention. Next, a planarizing oxide layer 240 is formed, and contact and metallization processes are performed. The metal bitlines 216 run over and perpendicular to the wordlines 236 and the buried source lines 212. This is followed by formation of a protective dielectric. There are a number of significant differences in the structure of the array of FIGS. 2A–2D from that of conventional arrays. The source lines 212 are covered by thick rather than thin oxide. The dopant concentration in source regions 214 is different from that of the rest of source lines 212. In the embodiment in which the moat process is performed before source line implantation, the concentration of n+ at the intersection of the channel stop areas 222 and the source lines 212 is less than that of the rest of the source lines 212.

OTHER EMBODIMENTS

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method of fabricating rows and columns of CMOS memory cells in an array on a semiconductor substrate having a first conductivity type, said array having source lines parallel to said rows of cells, comprising the steps of:
    forming a column-photoresist pattern on the semiconductor surface to define field oxide isolation regions between areas where said columns of cells are to be formed;
    implanting a dopant of said first conductivity-type in areas not covered by said column-photoresist pattern to form a channel stop region;
    removing said column-photoresist pattern;
    forming a row-photoresist pattern on the semiconductor surface to define said source lines for connecting the sources of rows of said cells to be formed;
    implanting said source lines with a dopant of a second conductivity-type opposite said first conductivity-type along areas not covered by said row-photoresist pattern;
    removing said row-photoresist pattern; and then
    growing an oxide layer for isolation in said field oxide isolation regions.

2. The method of claim 1, wherein said step of fabricating a column-photoresist pattern is performed before said steps of fabricating a row-photoresist pattern and implanting said source lines, such that said source lines are implanted through portions of said column-photoresist pattern.

3. The method of claim 1, wherein said steps of fabricating said row-photoresist pattern and of implanting said source lines are performed before said step of fabricating said column-photoresist pattern.

4. The method of claim 1, wherein said step of fabricating a column-photoresist pattern comprises the substeps of depositing a resist layer, exposing and developing said resist layer to define said column-photoresist pattern, and etching said resist layer to define said column-photoresist pattern, and etching said resist layer to remove areas not covered by said column-photoresist pattern.

5. The method of claim 1, wherein said dopant of said second conductivity-type is an n-type doping agent.

6. The method of claim 1, wherein said growing the oxide layer in said field oxide regions is performed by means of a localized oxidation process.

7. The method of claim 1, and further comprising the steps of oxidizing said source lines at the same time as growing the oxide layer in said field oxide regions.

* * * * *